United States Patent [19]
Miyake et al.

[11] Patent Number: 5,469,489
[45] Date of Patent: Nov. 21, 1995

[54] PRODUCTION METHOD OF AN X-RAY MASK STRUCTURE, AN X-RAY MASK STRUCTURE PRODUCED THEREBY, AND A DEVICE FABRICATED BY USING THE X-RAY MASK STRUCTURE

[75] Inventors: Akira Miyake, Isehara; Yasuaki Fukuda, Hadano; Hiroshi Maehara, Yokohama, all of Japan

[73] Assignee: Canon Kabushiki Kaisha, Tokyo, Japan

[21] Appl. No.: 413,930

[22] Filed: Mar. 30, 1995

Related U.S. Application Data

[63] Continuation of Ser. No. 92,037, Jul. 15, 1993, abandoned.

[30] Foreign Application Priority Data

Jul. 20, 1992 [JP] Japan .................................. 4-192194
Jun. 30, 1993 [JP] Japan .................................. 5-161960

[51] Int. Cl.⁶ .................................................. H01L 39/00
[52] U.S. Cl. .................................... 378/35; 378/34; 430/5
[58] Field of Search ............................ 378/34, 35; 430/5

[56] References Cited

U.S. PATENT DOCUMENTS 5,012,500  4/1991  Watanabe et al. ........................ 378/35
5,052,033  9/1991  Ikeda et al. ............................... 378/35
5,177,773  1/1993  Oizumi et al. ............................ 378/34

FOREIGN PATENT DOCUMENTS 0252416  2/1990  Japan .

*Primary Examiner*—David P. Porta
*Attorney, Agent, or Firm*—Fitzpatrick, Cella, Harper & Scinto

[57] ABSTRACT

The present invention provides a simple and easy processing method for producing an X-ray mask structure having an X-ray absorber whose side walls have waviness. More specifically, in accordance with the present invention, the method for producing an X-ray mask structure which comprises an X-ray absorber, an X-ray transmissive membrane for supporting the X-ray absorber, and a supporting frame for supporting the X-ray transmissive membrane, includes a step of forming the X-ray absorber by depositing an X-ray absorber material in the regions between resist patterns, the above resist patterns having waviness on the side walls of the resist patterns.

17 Claims, 13 Drawing Sheets

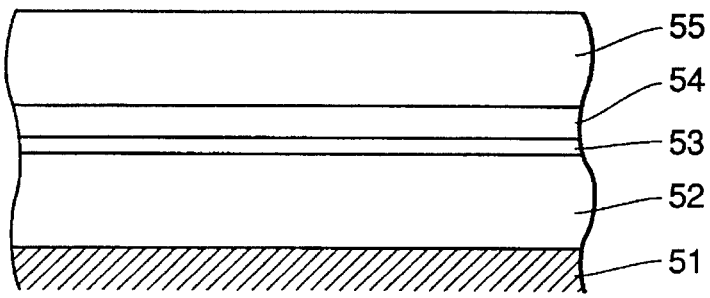
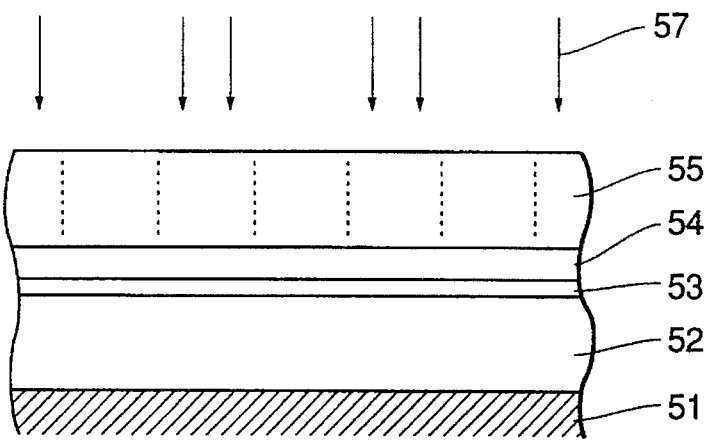
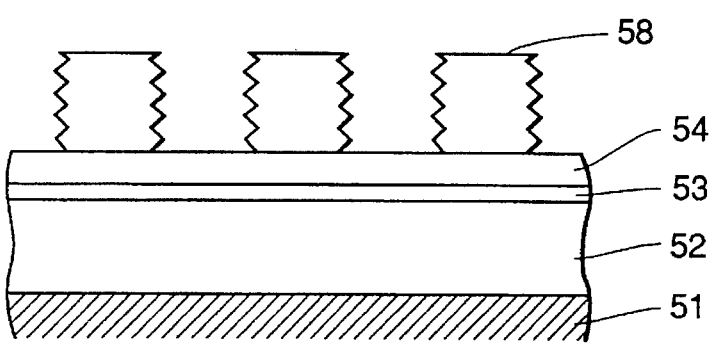

PRODUCTION METHOD OF AN X-RAY MASK STRUCTURE, AN X-RAY MASK STRUCTURE PRODUCED THEREBY, AND A DEVICE FABRICATED BY USING THE X-RAY MASK STRUCTURE

This application is a continuation of prior application, Ser. No. 08/092,037 filed Jul. 15, 1993, now abandoned.

BACKGROUND OF THE INVENTION

1. Field of the Invention

The present invention relates to an X-ray mask structure for use in lithography processes in fabrication of large scale integrated circuits (LSI) or micromachines, in which fine patterns are printed on a wafer by means of X-ray exposure.

2. Description of the Related Art

As a result of the very rapid advancement of the technology of very large scale integrated circuits, 4M-DRAMs are now in mass production and 16M-DRAMs or, further, 64M-DRAMs will be in mass production in the near future. As a result of such technology advances, a minimum feature size of 0.5 μm or even 0.25 μm is now required in device fabrication. In device fabrication processes, patterns are transferred from a mask to a semiconductor substrate by use of near ultraviolet light or deep ultraviolet light. However, the minimum feature size has already reached values near the ultimate resolution limit that is attainable by using light of such wavelengths. Furthermore, as the device size becomes smaller, an inevitable reduction occurs in the depth of focus. In view of the above, X-ray lithography technology is generally expected to resolve all the above problems at the same time.

In general, a mask structure for use in an X-ray exposure process comprises fine patterns of X-ray absorber 3 formed on an X-ray transmissive membrane 2 on an adequate supporting frame 1, as shown in FIGS. 1(A) and 1(B).

A known material used for an X-ray absorber includes heavy metal such as gold, tungsten and tantalum. A known material used for an X-ray transmissive membrane for supporting the patterned X-ray absorber includes a silicon compound such as silicon nitride and silicon carbide.

There are a few known methods for forming the pattern of an X-ray absorber, including a plating method in which a resist pattern is used as a stencil, a dry processing method in which a pattern is formed on a thin film of heavy metal by means of a dry process such as reactive ion etching, and a wet processing method in which patterning is performed by using an adequate etching solution.

From the point of view of the effect of Fresnel diffraction which occurs when an X-ray is incident on an X-ray mask, it is reported that an absorber having a cross section with a non-rectangular profile can provide a better pattern transfer to a resist (Japanese Patent Application Laid-Open No. 2-52416).

Furthermore, waviness of a side wall of the absorber avoids the reduction of resolution due to the degradation of contrast of the X-ray intensity at the surface of the resist which results from the reflection of the X-ray incident on the X-ray mask from the side walls of the absorber. This will be discussed in more detail hereinbelow.

In a process for transferring a pattern from an X-ray exposure mask to a resist, the mask (2, 3) is placed at the distance of a few tens of μm from the resist 4 so as to avoid breakage of the mask, as shown in FIG. 2. Then, the resist is exposed to the X-rays 5 through the mask so that the pattern of the absorber 3 is transferred to the resist. However, the exposing X-rays used in this process are not always parallel rays, and the side walls of the absorber are not always vertical depending on the production process. As a result, a portion of the exposing X-rays 5 graze the surface of the side walls of the absorber 3. Thus, a portion of the exposing X-rays 5 are reflected from the side walls of the absorber 3. After reflection, these X-rays propagate in different directions from those of non-reflected X-rays 5, and expose some regions of the resist 4 which are intended to be effectively shielded by the absorber 3 so that the X-rays 5 cannot reach these regions. This results in reduction of resolution of the transferred patterns. This problem can be solved by introduction of waviness on the side walls of the absorber 3.

Reflectivity of an X-ray incident on a substance varies depending on its incident angle. When an X-ray is incident on a substance at an angle almost parallel to the surface, that is, at an incident angle near 90°, total reflection occurs and the reflectivity is almost 100%. However, as the incident angle decreases from 90°, the reflectivity decreases quickly.

FIG. 3 shows a dependence of reflectivity on incident angle for a 1 nm wavelength X-ray incident on a surface of gold. As seen from this figure, in a range of incident angle from 88° to 90°, the reflectivity is larger than 50%. However, as the incident angle decreases, the reflectivity drops quickly, and the reflectivity is less than 1% when the incident angle is less than 85°. When the side walls of the X-ray absorber have a smooth surface with no waviness, the X-rays are incident at angles almost parallel to the surface and a large portion of the incident X-rays are reflected.

On the other hand, as shown in FIG. 4, if the side walls of the absorber 3 have waviness, the X-rays are incident at very small angles on the absorber 3, thus reflectivity becomes very small. That is, if waviness having slopes steeper than 5° with respect to the X-ray direction is introduced on the side walls of the absorber 3, then the reflectivity becomes less than 1%, thus solving the problem of degraded resolution due to the exposure of the resist 4 to the unwanted reflected X-rays.

However, it has been difficult to provide a high precision X-ray mask because of the complicated process required to produce X-ray absorber patterns having arbitrary forms of cross section.

SUMMARY OF THE INVENTION view of the above, it is an object of the present invention to provide a simple and easy process to produce an X-ray mask structure having X-ray absorber patterns with an arbitrary form of waviness on side walls of the X-ray absorber patterns.

The above object can be achieved by the present invention described hereinbelow.

That is, the present invention provides a method for producing an X-ray mask structure which comprises an X-ray absorber, an X-ray transmissive membrane for supporting the X-ray absorber, a supporting frame for supporting the X-ray transmissive membrane, including a step of forming an X-ray absorber by depositing an X-ray absorber material in the regions between resist patterns having waviness on the side walls.

BRIEF DESCRIPTION OF THE DRAWINGS

FIGS. 5(A) through 5(D) are schematic illustrations of a first example of sequential processes for producing an X-ray mask structure;

DESCRIPTION OF THE PREFERRED EMBODIMENTS

Figure 1A:
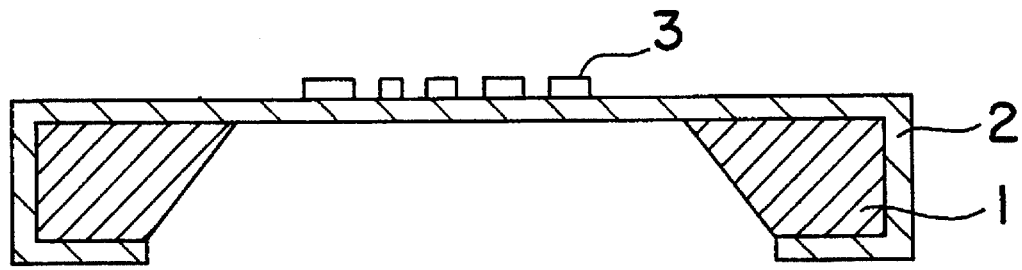
FIG. 1(A) is a cross sectional view showing schematically an X-ray mask structure in accordance with the present invention and FIG. 1(B) shows an elongated view of a section of FIG. 1(A)
Figure 1B:
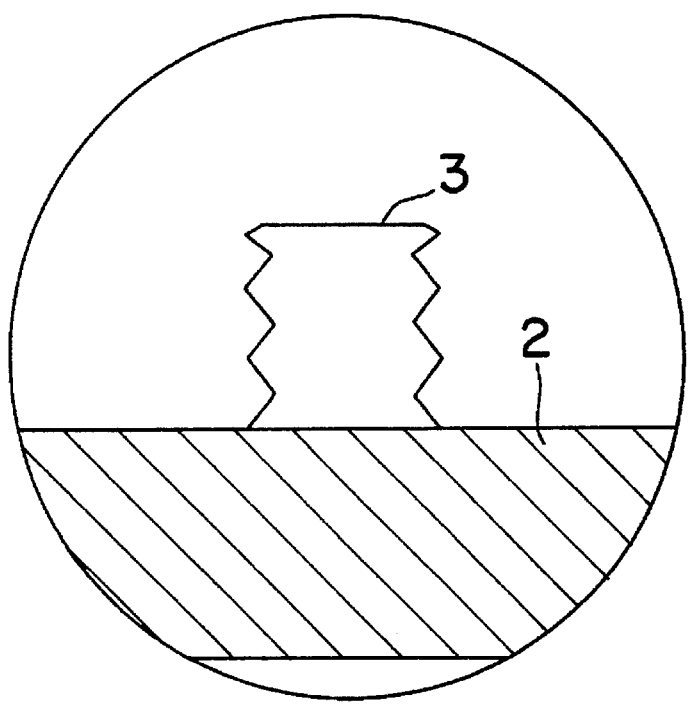
Figure 2:
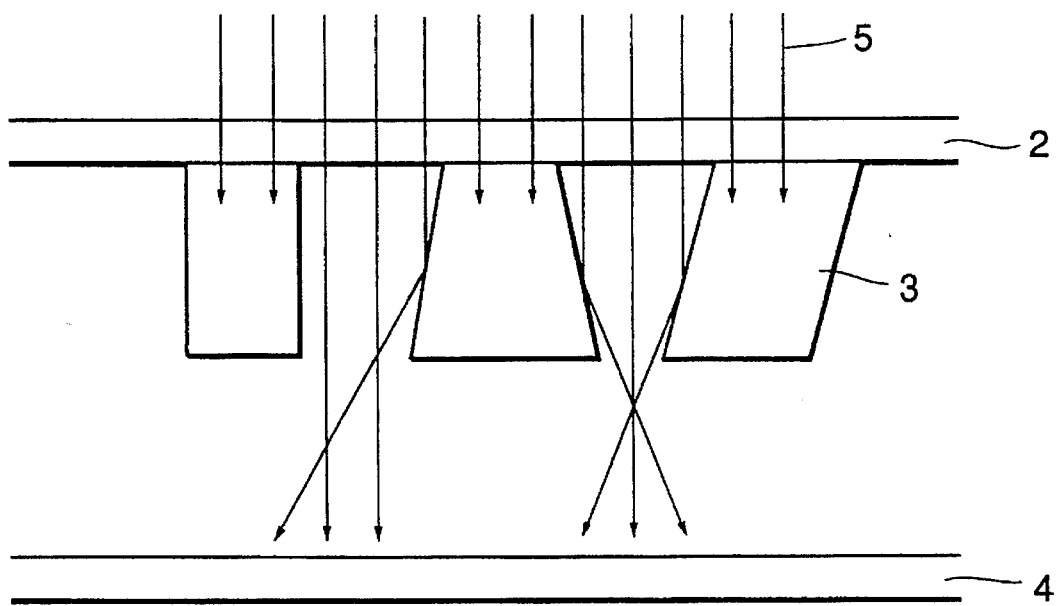
FIG. 2 is a schematic illustration of the pattern transfer performed by an X-ray mask structure.
Figure 3:
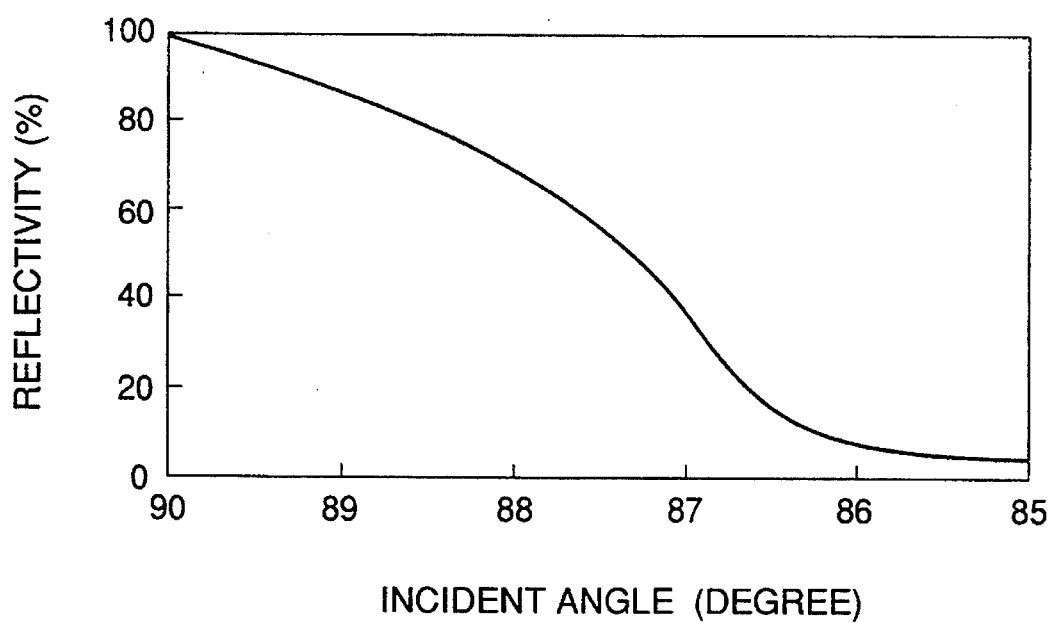
FIG. 3 shows a dependence of reflectivity on incident angle for a 1 nm wavelength X-ray incident on a surface of gold.
Figure 4:
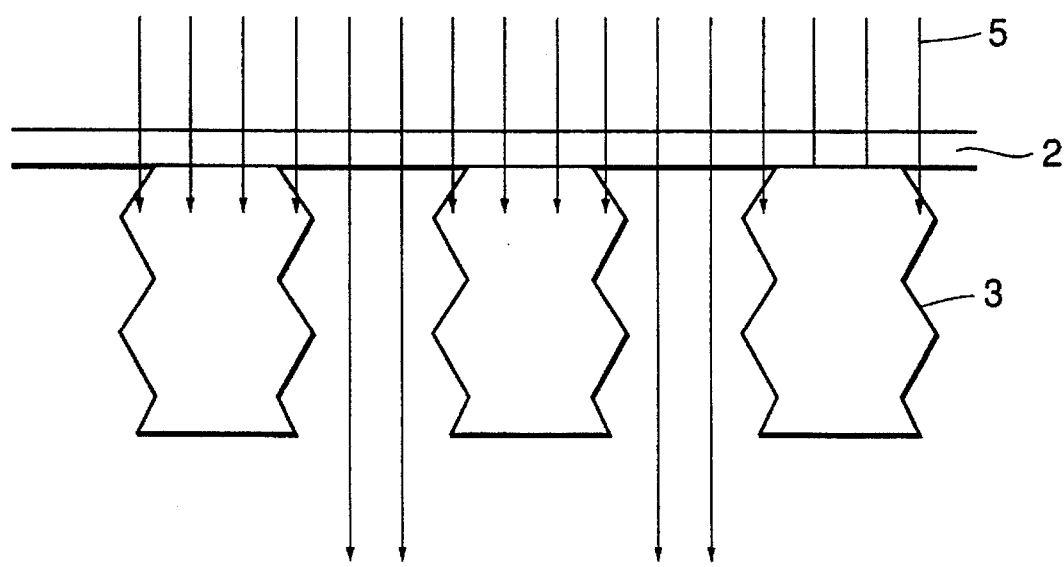
FIG. 4 is a schematic illustration of the pattern transfer performed by an X-ray mask structure having wariness on the side walls of an X-ray absorber.

Now, preferred aspects of tile present invention will be described hereinbelow.

In accordance with the present invention, methods for forming resist patterns having waviness on the side walls, include:

1. A method wherein waviness is formed by means of photolithography;

2. A method including the steps of:
uniformly exposing a resist material; and
performing pattern-exposure on the resist material;

3. A method including the step of performing pattern-exposure on a multi-layer resist material which comprises a plurality of different layers of resist; and 4. A method wherein patterns are formed by performing pattern-exposure on a multi-layer resist material formed by repeatedly performing the process consisting of the steps of coating a resist and performing alkali-treating on the surface of the resist.

Any of the above four methods can be effectively used. However, among those four methods, methods 2, 3, and 4 are especially preferable.

Exposure tools, which can be used in the above method 1, include a step-and-repeat projection exposure tool (stepper) using a line spectrum of mercury lamp or xenon lamp, a mirror projection exposure system (mask aligner), a proximity exposure system (mask aligner), and a step-and-repeat projection exposure system (stepper) using an excimer laser as a light source.

In pattern exposure using any one of the above tools, standing waves of exposure light introduce a periodic distribution in exposure intensity in the depth direction (in the thickness direction) of a resist, thus after development waviness appears on the side walls of the resist patterns. In the above method 2, if a resist material is uniformly exposed to visible light or ultraviolet light, then standing waves of exposure light introduce a periodic distribution in exposure intensity in the depth direction (in the thickness direction) of a resist, thus after development waviness appears on the side walls of the resist patterns. In the step of pattern exposure of the resist material, not only light but also electron beams can be advantageously used.

In preferred aspects of the methods 1 and 2, a reflection layer for reflecting the light is provided as an underlying layer beneath the resist material. This reflection layer enhances the effect of standing waves of light, thus resulting in a larger periodic distribution in exposure intensity of the resist material in the depth direction. Therefore, resultant waviness shows larger amplitudes, which further results in larger amplitudes of waviness formed on the side walls of the X-ray absorber. Thus, the reflectivity of X-rays at these side walls is further decreased. In another preferred aspect, the exposing light is applied at an oblique angle to the resist material so as to make the period of the standing wave shorter. As a result, because it is possible to have larger slopes of the waviness on the side walls of the resist patterns, the slopes of the waviness formed on the side walls of the X-ray absorber become larger. Thus, the reflectivity of X-ray at these side walls becomes smaller.

In the method 3, pattern-exposure is performed on a multi-layer resist consisting of a plurality of resists having different sensitivities coated one on another so as to form waviness on the side walls of the resist patterns obtained after development. Also in method 3, the electron beam exposure can be advantageously used for resist pattern exposure.

In the method 4, a layer of resist is formed in such a manner 1.0 that its thickness corresponds to the desired pitch of waviness. Then the layer of resist is heat-treated and is further surface-treated in an alkali solution. These steps are repeated several times so as to form a multi-layer resist structure having a distribution of dissolving rate in the thickness direction of the resist structure. When the multi-layer resist structure formed in this way is developed to form resist patterns, the dissolving rate for the development solution drops at the surface of each resist layer due to the alkali treatment performed on the surface. Thus, resultant final resist patterns have waviness on the side walls. Also in method 4, in addition to light exposure, electron beam exposure can be advantageously used for resist pattern exposure.

In the method for producing an X-ray mask structure in accordance with the present invention, the other processes except for those for forming the X-ray absorber described above are the same as those in known methods. Available materials for each element of an X-ray mask structure are as follows: A silicon wafer, for example, can be used for a mask supporting frame. The X-ray transmissive membrane can be made of a known material having a thickness in the range from 1 µm to 10 µm, including an inorganic film such as Si, $SiO_2$, SiC, SiN, SiCN, BN, and BNC and organic film exhibiting radiation durability such as polyimide. In addition to those, another material adequate for an X-ray absorber may be also used.

The materials for X-ray mask patterns for absorbing X-rays include a heavy metal material such as Au, W, Ta, and Pt, and an adequate compound of these elements.

As for a material for a mask holder frame, various materials are available such as pyrex glass, Ti, Fe-Co alloy, and ceramics.

In addition to the materials described above, the X-ray mask structure in accordance with the present invention may be further provided with a protection film for the X-ray absorber, and/or electric conductive film, and/or anti-reflection film to alignment light. Furthermore, a holder frame (mask frame) may be provided for convenience in transferring of a mask substrate.

Referring to the figures, specific examples will be described hereinbelow for illustration of the embodiments of the present invention. The present invention is not limited to those examples described herein.

Embodiment 1

A silicon nitride film 52 for an X-ray transmissive membrane having a thickness of 2 μm was formed on a silicon wafer 51. Then, a 10 nm chromium film 53 and a 50 nm gold film 54 were formed by means of vacuum evaporation, and furthermore, the top of these films was coated with a 1.5 μm thick novolak-resin-based resist 55. This resultant wafer was uniformly exposed to monochromatic ultraviolet light rays 56 having a wavelength of 365 nm (FIG. 5A). As a result of this exposure, the standing waves resulted in periodic distribution of exposure intensity in the thickness direction of the resist. Then, the resist was exposed to form the circuit patterns by electron beams 57 with an electron beam exposure system (FIG. 5B). The resist was developed to obtain resist patterns 58 having periodic waviness on the side walls (FIG. 5C). The areas between these resist patterns were plated with gold by using the underlying metal as an electrode so as to form 1 μm thick X-ray absorber patterns 59 having waviness on the side walls. Then, the resist was removed. Furthermore, the electrode films (chromium, gold) were removed by means of dry etching and the silicon wafer was back-etched. Thus, a complete X-ray mask was obtained (FIG. 5D). The cross sections of the X-ray absorber patterns had sine-wave like waviness with an amplitude of about 30 nm and a period of about 110 nm.

The X-ray absorber patterns of the completed X-ray mask were evaluated by using a scanning electron microscope. When pattern transfer was carried out using this X-ray mask structure, because there was no reflection of X-rays and because of the smaller influence of Fresnel diffraction, remarkable improvement was observed in resolution and pattern transfer accuracy, compared to the case where a conventional X-ray mask structure having an absorber with vertical side walls was used.

In this embodiment, after the resist was uniformly exposed to ultraviolet light, the resist was exposed to form the patterns to be transferred. However, as a matter of course, exposure may be performed in the opposite order.

Embodiment 2

Figure 6A:
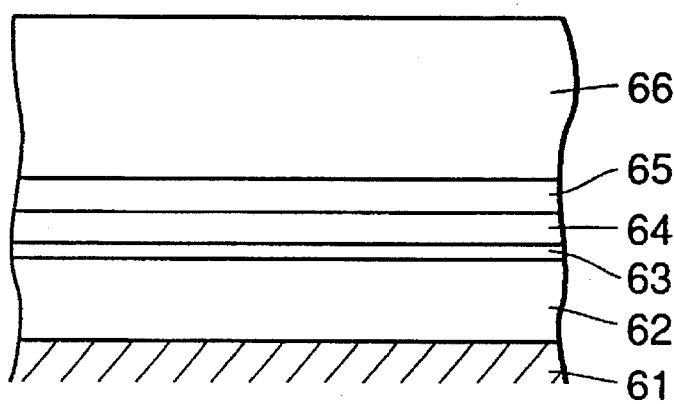
FIGS. 6(A) through 6(C) are schematic illustrations of a second example of sequential processes for producing an X-ray mask structure.

A silicon nitride film 62 for an X-ray transmissive membrane having a thickness of 2 μm was formed on a silicon wafer 61. Then, a 10 nm chromium film 63, a 50 nm gold film 64, and an aluminum film 65 were formed by means of vacuum evaporation, and furthermore, the top of these films was coated with a 1.5 μm thick novolak-resin-based resist 66 (FIG. 6A).

Figure 6B:
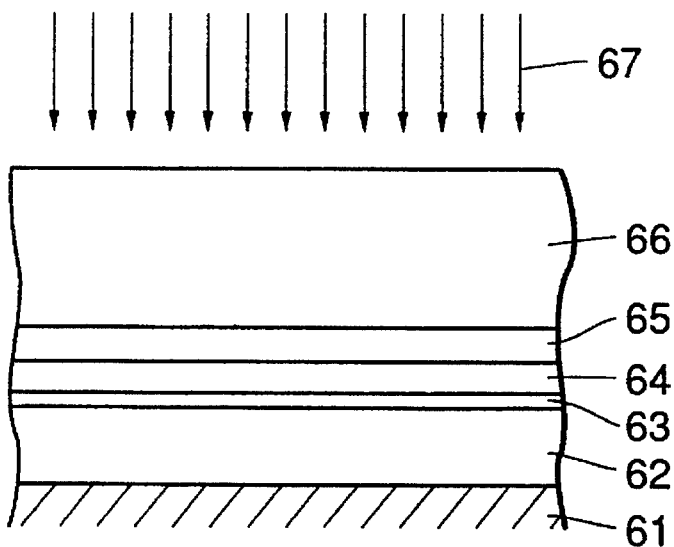
Figure 6C:
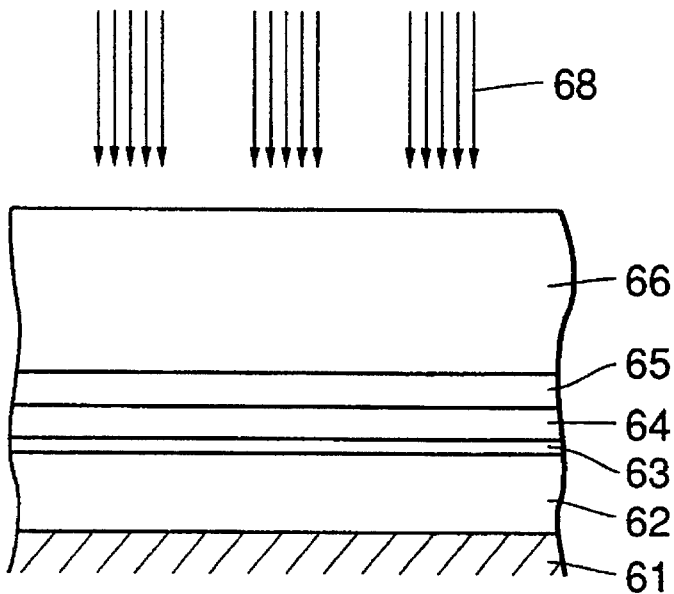
Figure 7D:
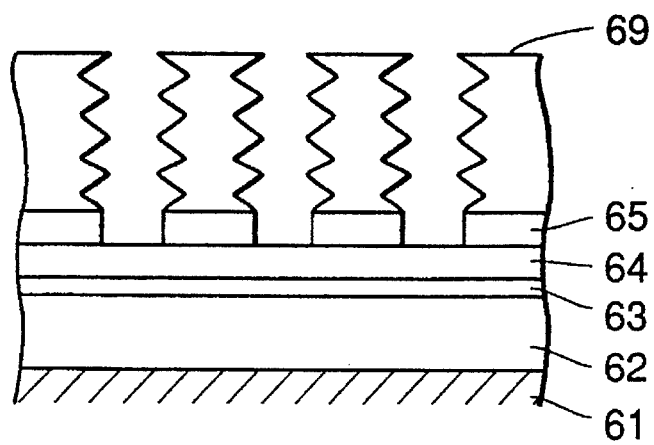
FIGS. 7(D) through 7(F) are schematic illustrations of a second example of sequential processes for producing an X-ray mask structure.

This wafer was uniformly exposed to 436 nm wavelength monochromatic ultraviolet light rays 67 incident at right angles on the wafer (FIG. 6B). As a result of this exposure, the standing wave resulted in periodic distribution of exposure intensity in the thickness direction of the resist material 66. Then, the resist material 66 was exposed to form the circuit patterns by electron beams 68 from an electron beam exposure system (FIG. 6C). The resist was developed to obtain resist patterns 69 having periodic waviness on the side walls. Then, an aluminum film 65 exposed between the resist patterns is removed by means of dry etching (FIG. 7D).

Figure 7E:
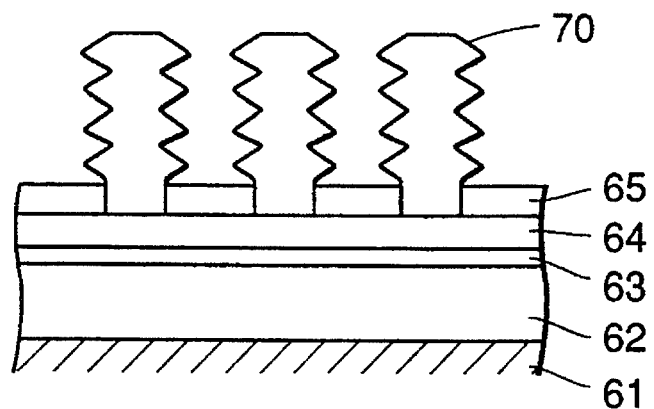
Figure 7F:
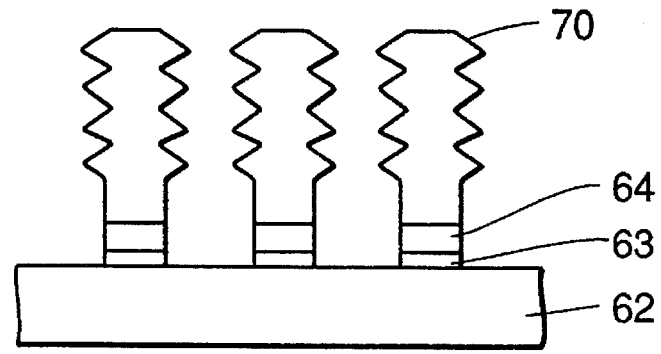

The areas between these resist patterns 69 were plated with gold by using the underlying metal 64 as an electrode so as to form 1 μm thick X-ray absorber patterns 70 having waviness on the side walls (FIG. 7E). Then, the resist layer was removed. Furthermore, the electrode films (chromium 63, gold 64) were removed by means of dry etching and the silicon wafer was back-etched. Thus, a complete X-ray mask structure was obtained (FIG. 7F). The cross sections of the X-ray absorber patterns had sine-wave like waviness with an amplitude of about 30 nm and a period of about 130 nm.

The completed X-ray absorber patterns of the X-ray mask were evaluated by using a scanning electron microscope. In this embodiment, the aluminum film 65 plays a role to increase the reflectivity of monochromatic ultraviolet light having a wavelength of 436 nm. This effect will be described in more detail below.

When light is incident on a substance with a refractive index $n2$ from a substance with a refractive index $n1$, the amplitude reflectance R at the interface is given by:

$$R=(n1-n2)/(n1+n2)$$

The energy reflectance is given by $R^2$. The refractive indices of a resist and gold for 436 nm wavelength light are 1.65 and 1.56, respectively. Therefore, if gold is used as an underlying layer beneath the resist, the amplitude reflectance is of the order of On the other hand, the ratio of light energy density of a standing wave between an antinode and a node is given by $\{(1+R)/(1-R)\}^2$. When gold is used as an underlying layer beneath a resist, this ratio is about 1.1, thus there occurs a very small periodic distribution of exposure intensity in the depth direction of the resist. To enhance the effect of standing waves and to obtain larger periodic distribution of exposure intensity in the depth direction of the resist, it is required to increase the reflectivity at the interface. From this point of view, let us consider the case where aluminum is used as an underlying layer beneath a resist. The refractive index of aluminum is 0.56 for the 436 nm wavelength light, thus the amplitude reflectance is 49% and the ratio of light energy density of a standing wave between an antinode and a node is 8.5, which means that there occurs a large periodic distribution of exposure intensity in the depth direction of the resist.

As obvious from the above discussion, as for an underlying layer beneath a resist, it is required to select a material which can exhibit high reflectivity at the interface between this material and the resist. However, it is difficult to form a gold layer on an aluminum layer by electroplating. Thus, in this embodiment, a 3-level structure consisting of chromium, gold, and aluminum was used and aluminum was removed before electroplating.

When pattern transfer was carried out using this X-ray mask structure, because there was no reflection of X-rays and because of the smaller influence of Fresnel diffraction, remarkable improvement was observed in resolution and pattern transfer accuracy, compared to the case where a conventional X-ray mask structure having an absorber with vertical side walls was used.

In this embodiment, after the resist was uniformly exposed to ultraviolet light, the resist was exposed to form the patterns to be transferred. However, as a matter of course, exposure may be performed in the opposite order.

Embodiment 3

Figure 8A:
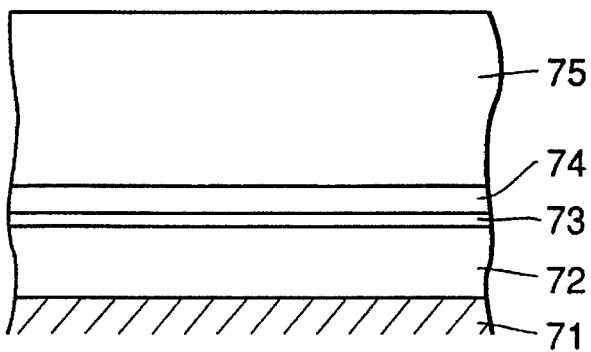
FIGS. 8(A) through 8(C) are schematic illustrations of a third example of sequential processes for producing an X-ray mask structure.
Figure 8B:
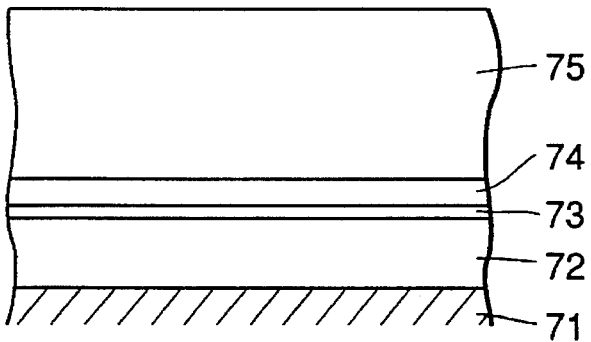
Figure 8C:
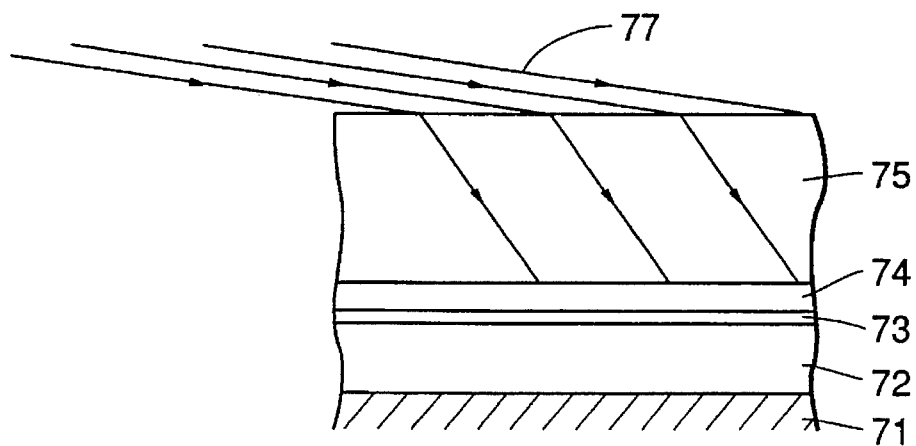
Figure 9D:
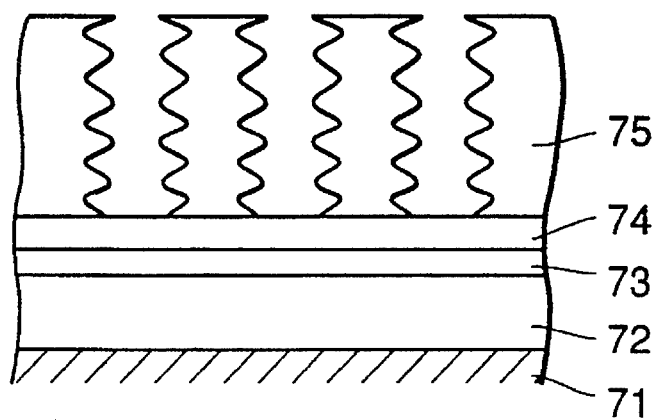
FIGS. 9(D) through 9(F) are schematic illustrations of a third example of sequential processes for producing an X-ray mask structure.

A silicon carbide film 72 for an X-ray transmissive membrane having a thickness of 2 μm was formed on a silicon wafer 71. Then, a 10 nm chromium film 73 and a 300 nm copper film 74 were successively formed by vacuum-evaporation, and furthermore, the top of these films was coated with a 1.2 μm thick novolak-resin-based resist 75 (FIG. 8A). Then, this resist was exposed to form the circuit patterns by electron beams (FIG. 8B). Furthermore, this wafer was uniformly exposed to 436 nm wavelength monochromatic ultraviolet light incident at 80° on the wafer (FIG. 8C). As a result of this exposure, the standing wave resulted in periodic distribution of exposure intensity in the thickness direction of the resist. The resist was developed to obtain resist patterns 75 having periodic waviness on the side walls (FIG. 9D).

Figure 9E:
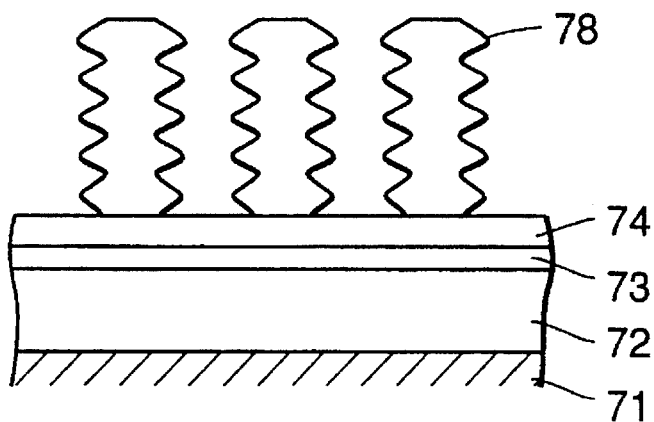
Figure 9F:
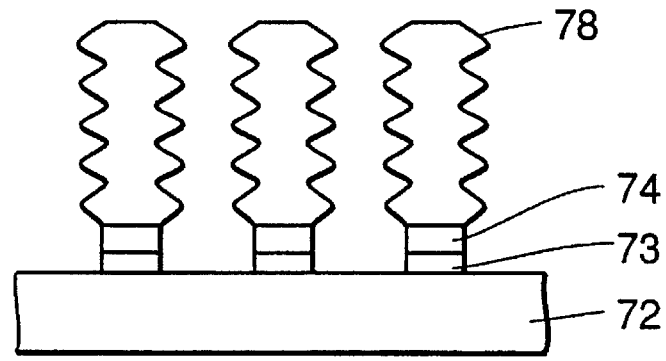

The areas between these resist patterns 75 were plated with gold by using the underlying copper layer 74 as an electrode so as to form 1 μm thick X-ray absorber patterns 78 having waviness on the side walls (FIG. 9E). Then, the resist was removed. Furthermore, the electrode films (chromium 73, copper 74) were removed by means of dry etching and the silicon wafer was back-etched. Thus, a complete X-ray mask structure was obtained (FIG. 9F). The cross sections of the X-ray absorber patterns had sine-wave like waviness with an amplitude of about 20 nm and a period of about 104 nm.

The X-ray absorber patterns 78 of the completed X-ray mask were evaluated by using a scanning electron microscope. In this embodiment, monochromatic ultraviolet light is incident at an oblique angle so as to make a period of the standing wave shorter, which results in more effective suppression of degradation of resolution due to the reduction in contrast of X-ray intensity on the resist, wherein the reduction of X-ray intensity results from the reflection of the incident X-rays at the side walls of the absorber. This effect will be described in more detail below.

When light is incident at an angle $\theta o$ on a substance with a refractive index n1 from a substance with a refractive index of n0, the light travels in the substance with refractive index n1 in the direction indicated by the following angle:

$$\theta 1 = \sin^{-1}\{\sin(\theta o) \times n0/n1\}$$

And, the period of the standing wave of this light is given by:

$$\lambda/n1 \times \cos(\theta 1)$$

In embodiment 3, θ1 becomes about 36°, which means that the period of the standing wave became shorter by about 20% with respect to the period as in the case where the monochromatic ultraviolet light is incident at a right angle. When the amplitudes of waviness on the side walls are the same, a shorter period of the standing wave results in a steeper slope of the waviness on the side walls. Therefore, if this resist pattern is used as a stencil to form the X-ray absorber, steeper slopes can be obtained at the side walls. Thus, the reflectivity at the side walls is further decreased.

In the process of illumination of monochromatic ultraviolet light, the monochromatic ultraviolet light can be incident at a oblique angle on the resist whose surface is in contact with a substance having a refractive index near that of the resist or larger, as in the case where a substrate is immersed in a liquid solution. This method can avoid the problem that due to the refraction at the surface of the resist, the light travels in the resist in the almost vertical direction and the period of the standing wave does not become considerably shorter.

In this embodiment, a copper layer is used as an electrode for plating, thus it is possible to form gold patterns directly on the copper layer by means of electroplating. As required, it is possible to further improve the adhesion properties of plating by means of, for example, striking treatment.

When pattern transfer was carried out using this X-ray mask structure, because there was no reflection of X-rays and because of the smaller influence of Fresnel diffraction, remarkable improvement was observed in resolution and pattern transfer accuracy, compared to the case where a conventional X-ray mask structure having an absorber with vertical side walls was used.

Embodiment 4

Figure 10A:
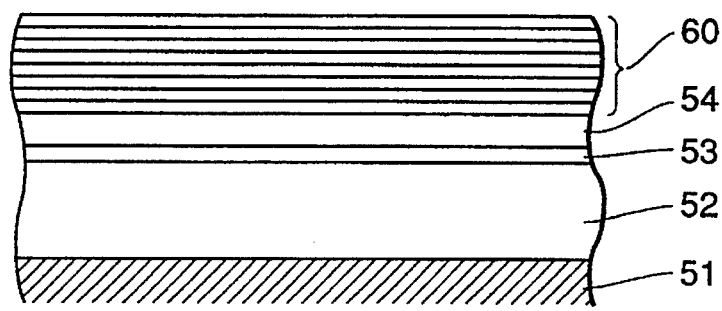
FIGS. 10(A) through 10(D) are schematic illustrations of a fourth example of sequential processes for producing an X-ray mask structure.
Figure 10B:
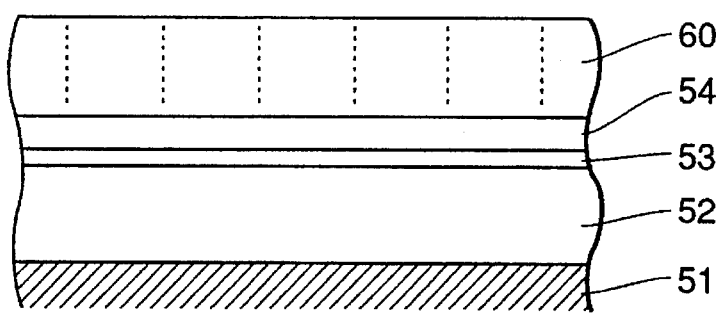
Figure 10C:
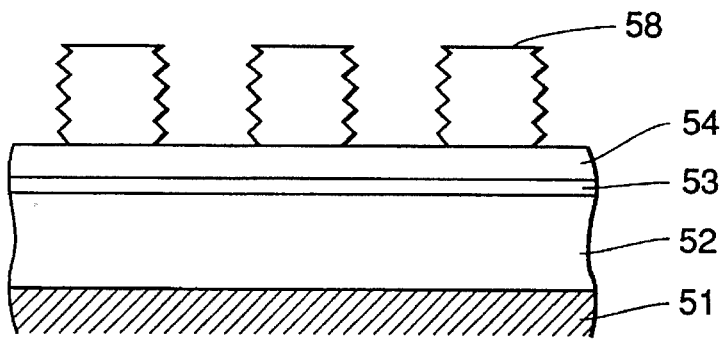
Figure 10D:
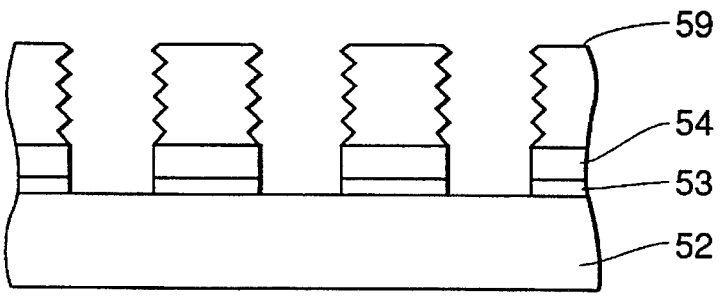

A silicon carbide film 52 as an X-ray transmissive membrane having a thickness of 2 μm was formed on a silicon wafer 51. Then, a 10 nm chromium film 53 and a 200 nm gold film 54 were formed by vacuum-evaporation. Then, the top of these films was covered with a multi-layer resist 60 consisting of 12 levels in total which were formed by alternately coating a 0.1 μm thick high sensitivity PMMA resist having a larger molecular weight and a 0.1 μm thick low sensitivity PMMA resist having a smaller molecular weight (FIG. 10A). Then, this multi-layer resist was exposed to electron beams 57 to form the circuit patterns 57 to be transferred (FIG. 10B). The resist was developed in a common way. Due to the difference in sensitivity among layers of the resist, waviness appeared on the side walls of the resultant resist patterns 58 (FIG. 10C). The areas between these resist patterns 58 were plated with gold by using the underlying metal as an electrode so as to form 0.8 μm thick X-ray absorber patterns 58 having waviness on the side walls. Then, as in embodiment 1, after the resist was removed, the electrode films (chromium 53, gold 54) were removed by means of dry etching and the silicon wafer was back-etched. Thus, a complete X-ray mask structure was obtained (FIG. 10D).

When pattern transfer was carried out using this X-ray mask structure, remarkable improvement could be seen in resolution and pattern transfer accuracy compared to the case where a conventional X-ray mask structure having an absorber with vertical side walls was used.

Embodiment 5

Figure 11A:
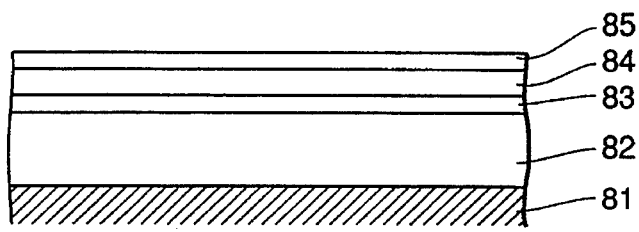
FIGS. 11(A) through 11(E) are schematic illustrations of a fifth example of sequential processes for producing an X-ray mask structure.
Figure 11B:
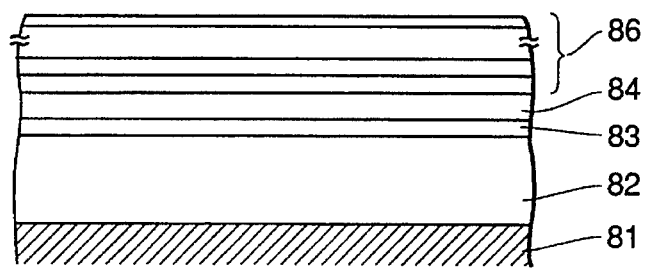
Figure 11C:
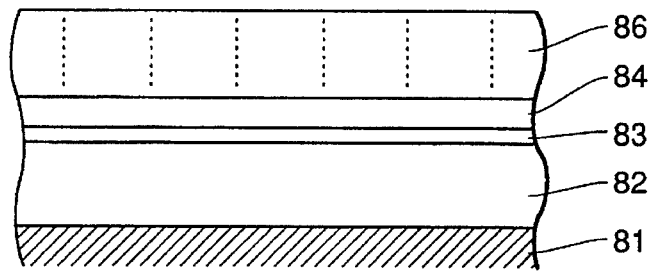
Figure 11D:
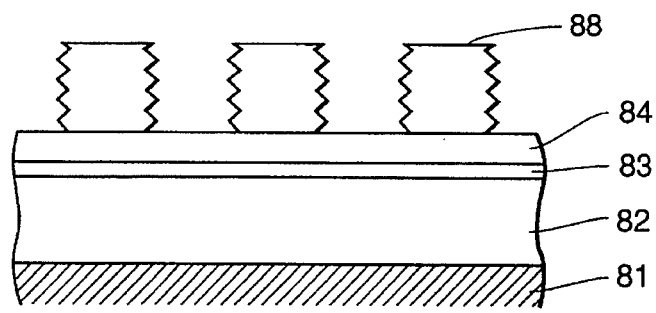

A silicon nitride film 82 as an X-ray transmissive membrane having a thickness of 2 μm was formed on a silicon wafer 81. Then, a 10 nm chromium film 83 and a 200 nm gold film 84 were formed by vacuum-evaporation. Then, the top of these films was covered with a 110 nm thick novolak-resin-based chemical-amplification type resist 85 (RAY-PF, Hoechst). After the resist was heat-treated on a hot plate, the wafer was surface-treated in an aqueous solution of 1.5%-tetramethylammonium hydroxide (FIG. 11A). After the resist process was repeated 19 times, the resist structure 86 having a thickness of 1.4 μm was obtained (FIG. 11B). Then, this resist was exposed by electron beams to form the patterns to be transferred (FIG. 11C). After the resist was developed, periodic waviness appeared on the side walls of the resultant resist patterns 88 due to the distribution of dissolving rate introduced in the resist (FIG. 11D).

Figure 11E:
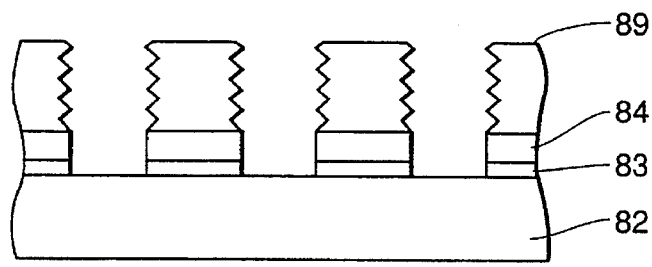

The areas between these resist patterns were plated with gold by rising the underlying metal as an electrode so as to form 1 µm thick X-ray absorber patterns having waviness on the side walls. Then, the resist was removed, and the electrode films (chromium 83, gold 84) were removed by means of dry etching. Then, the silicon wafer was back-etched. Thus, a complete X-ray mask structure was obtained (FIG. 11ED). The cross sections of the X-ray absorber patterns had sine-wave like waviness with an amplitude of about 30 nm and a period of about 110 nm.

The X-ray absorber patterns of the completed X-ray mask were evaluated by using a scanning electron microscope, when pattern transfer was carried out using this X-ray mask structure. Because there was no reflection of X-rays and because of the smaller influence of Fresnel diffraction, remarkable improvement was observed in resolution and pattern transfer accuracy, compared to the case where a conventional X-ray mask structure having an absorber with vertical side walls was used.

As described above, in the process of X-ray exposure, the X-ray mask structures produced in this way showed little influence of unwanted reflection of X-rays from the side walls of the X-ray absorber patterns and also showed little influence of the diffraction at the edges of the X-ray absorber patterns. Thus, it was possible to form patterns which were extremely faithful to the designed device line widths. Furthermore, the devices fabricated by means of X-ray exposure using such an X-ray mask described above showed good device characteristics due to the fact that the designed patterns were faithfully realized in the resultant devices.

Figure 12:
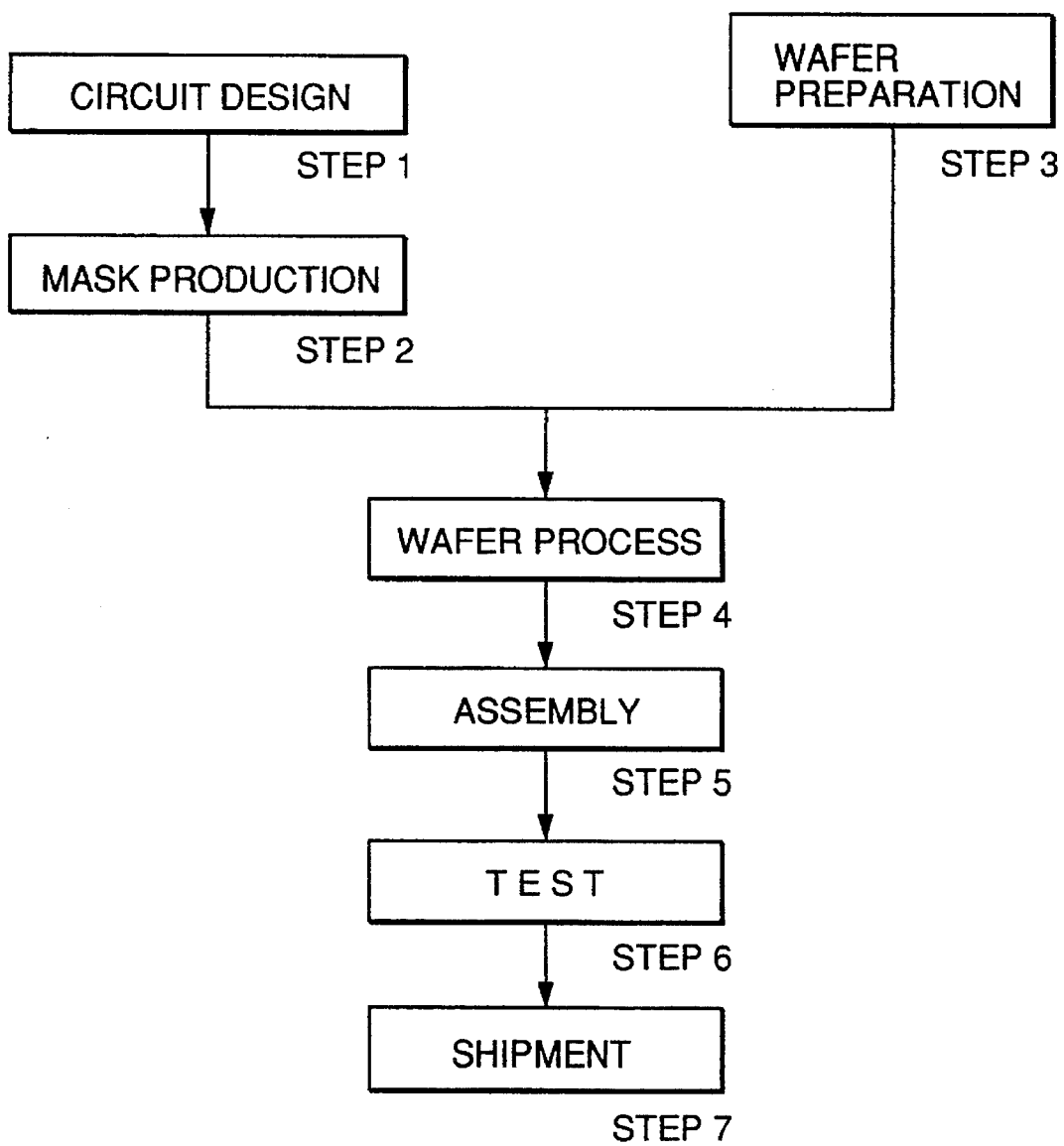
FIG. 12 is a flowchart of semiconductor device production.

Now, hereinbelow will be described an example of a fabrication method of a device using an X-ray mask structure discussed above. FIG. 12 is a flowchart showing fabrication processes of a device (for example, a semiconductor chip such as IC and LSI, a liquid-crystal display panel, a CCD, etc.). In step 1 (circuit design), circuit design is carried out for the semiconductor device. In step 2 (mask production), an X-ray mask is produced which includes circuit patterns of the designed circuit. In parallel to these steps, in step 3 (wafer preparation), a wafer is produced from a silicon material or the like. In step 4 (wafer process), using the X-ray mask structure and the wafer prepared in the above steps, an actual circuit is formed on the wafer by means of lithography technology. In the next step 5 (assembly), the wafer fabricated in step 4 is divided into individual chips and further assembled. This step includes dicing, bonding, and packaging (sealing of chip). In step 6 (testing), the semiconductor devices fabricated in step 5 are subjected to the evaluation such as operation test and reliability test. After these steps, the semiconductor devices are completed and shipped (step 7).

Figure 13:
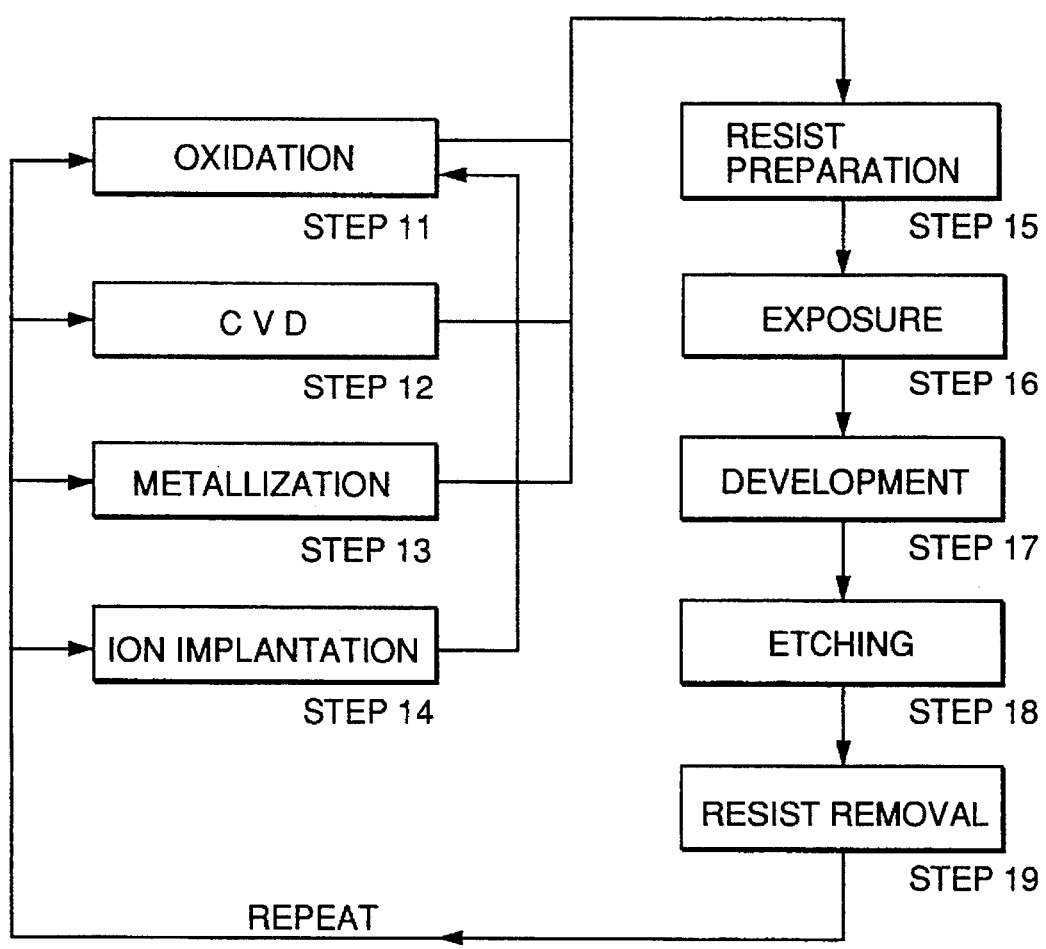
FIG. 13 shows a wafer process.

FIG. 13 is a flowchart showing a wafer process in more detail. In step 11 (oxidation), the surface of the wafer is oxidized. In step 12 (CVD), an insulating film is formed on the surface of the wafer. Then, in step 13 (metallization), electrodes are formed on the surface of the wafer by means of successive evaporation. In step 14 (ion implantation), ions are implanted into the wafer. In step 15 (resist preparation), an X-ray sensitive material (resist) is coated on the wafer. Then, in step 16 (exposure), exposure of the circuit pattern of the mask is performed on the wafer by the exposure methods discussed above. In step 17 (development), the exposed wafer is developed. In step 18 (etching), the portions except for the resist image formed by the development are etched. In step 19 (resist removal), the remaining resist which became unnecessary after the etching process is removed. By repeating these steps, multi-level circuit patterns are formed on the wafer.

The fabrication method in accordance with the present invention realizes the production of high-integration density semiconductor devices which are difficult to be produced by conventional fabrication technologies.

What is claimed is:

1. A method for producing an X-ray mask structure having an X-ray absorber on an X-ray transmissive membrane, said method comprising the steps of:

forming resist patterns having wavy side walls on an X-ray transmissive membrane; and depositing an X-ray absorber material in the regions between resist patterns.

2. A method of producing an X-ray mask structure as defined in claim 1, wherein said forming step comprises:

depositing a resist material on the X-ray transmissive membrane; and.

performing pattern-exposure on the resist material using exposure light.

3. A method for producing an X-ray mask structure as defined in claim 1, wherein said forming step comprises:

depositing a resist material on the X-ray transmissive membrane;

uniformly exposing the resist material to standing waves of light; and performing pattern-exposure on the resist material.

4. A method for producing an X-ray mask structure as defined in claim 3, wherein said forming step further comprises providing, as an underlying layer beneath the resist material, a reflection member for reflecting the light used in said step for uniformly exposing the resist material.

5. A method for producing an X-ray mask structure as defined in claim 3, wherein said step for uniformly exposing the resist material to light comprises exposing the resist material using light that is incident at an oblique angle to the resist material.

6. A method for producing an X-ray mask structure-as defined in claim 1, wherein said forming step comprises:

depositing a resist material on the X-ray transmissive membrane by sequentially depositing a plurality of different resist layers; and performing pattern-exposure on the resist material.

7. A method for producing an X-ray mask structure as defined in claim 1, wherein said forming step comprises:

depositing a resist material on the X-ray transmissive membrane by sequentially depositing a plurality of resist layers and alkali-treating a surface of each layer; and performing pattern-exposure on the resist material.

8. A method for producing an X-ray mask structure as defined in claim 1, wherein said forming step comprises:

depositing a resist material on the X-ray transmissive membrane;

generating a distribution of dissolving rate in the thickness direction of the resist material; and performing pattern-exposure on the resist material.

9. A method for producing an X-ray mask structure as defined in claim 8, wherein said step for generating a distribution of dissolving rate comprises exposing the resist material to standing waves of light to generate a distribution of exposure intensity in the thickness direction of the resist material.

10. A method for producing an X-ray mask structure as defined in claim 8, wherein said depositing step comprises sequentially depositing a plurality of resist layers having different sensitivities with respect to light and said step for generating a distribution of dissolving rate comprises exposing the resist material to exposure light.

11. A method for producing an X-ray mask structure as defined in claim 8, wherein said depositing step comprises sequentially depositing, and alkali-treating a surface of, a plurality of resist layers.

12. An X-ray mask structure comprising an X-ray absorber on an X-ray transmissive membrane, wherein said X-ray absorber has cross sections of sine-wave like waviness with a period in a range of 104 nm through 130 nm, and an amplitude in a range of 20 nm through 30 nm.

13. An X-ray mask structure comprising an X-ray absorber on an X-ray transmissive membrane, said X-ray absorber comprising (i) an area having no waviness on the side walls and (ii) an area having waviness on the side walls, in that order from said X-ray transmissive membrane, wherein said area having no waviness is in the range of 60 nm through 310 nm of the thickness of said X-ray absorber.

14. An X-ray mask structure according to claim 13, wherein said waviness of said X-ray absorber has cross sections of sine-wave like waviness with a period in a range of 104 nm through 130 nm and an amplitude in a range of 20 nm through 30 nm.

15. A device fabricated by means of X-ray exposure using an X-ray mask structure comprising an X-ray absorber on an X-ray transmissive membrane, wherein said X-ray absorber has cross sections of sine-wave-like waviness with a period in a range of 104 nm through 130 nm, and an amplitude in a range of 20 nm through 30 nm.

16. A device fabricated by means of X-ray exposure using an X-ray mask structure comprising an X-ray absorber on an X-ray transmissive membrane, said X-ray absorber comprising (i) an area having no waviness on the side walls and (ii) an area having waviness on the side walls, in that order from said X-ray transmissive membrane, wherein said area having no waviness is in the range of 60 nm through 310 nm of the thickness of said X-ray absorber.

17. A device according to claim 16, wherein said waviness of said X-ray absorber has cross sections of sine-wave-like waviness with a period in a range of 104 nm through 130 nm and an amplitude in a range of 20 nm through 30 nm.

* * * * *

UNITED STATES PATENT AND TRADEMARK OFFICE
CERTIFICATE OF CORRECTION

PATENT NO. : 5,469,489
DATED : November 21, 1995
INVENTOR(S) : Akira MIYAKE, et al.

Page 1 of 2

It is certified that error appears in the above-indentified patent and that said Letters Patent is hereby corrected as shown below:

ON THE TITLE PAGE:

Under "FOREIGN PATENT DOCUMENTS":

"0252416 2/1990 Japan" should read --2-52416 2/1990 Japan--.

IN THE DISCLOSURE:

COLUMN 2:

Line 48, "view" should read --In view--; and

Line 66, "cross sectional" should read --cross-sectional--.

COLUMN 3:

Line 41, "tile" should read --the--.

COLUMN 4:

Line 7, "patterns. In" should read --patterns. ¶ In--; and

Line 41, "1.0" should be deleted.

UNITED STATES PATENT AND TRADEMARK OFFICE
CERTIFICATE OF CORRECTION

PATENT NO. : 5,469,489
DATED : November 21, 1995
INVENTOR(S) : Akira MIYAKE, et al.

It is certified that error appears in the above-indentified patent and that said Letters Patent is hereby corrected as shown below:

<u>COLUMN 6</u>:

Line 39, "of On" should read --of 3%.  On--.

<u>COLUMN 8</u>:

Line 66, "19 times," should read --13 times,--.

<u>COLUMN 9</u>:

Line 43, "tion) ," should read --tion),--.

<u>COLUMN 10</u>:

Line 23, "and." should read --and--; and

Line 44, "structure-as" should read --structure as--.

Signed and Sealed this

Twenty-third Day of April, 1996

Attest:

BRUCE LEHMAN

*Attesting Officer*     Commissioner of Patents and Trademarks